United States Patent
Kinugasa

(10) Patent No.: US 6,426,531 B1
(45) Date of Patent: Jul. 30, 2002

(54) SEMICONDUCTOR INTEGRATED CIRCUIT DEVICE AND A METHOD OF ASSEMBLY THEREOF

(75) Inventor: Yasushi Kinugasa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/577,374

(22) Filed: May 23, 2000

(30) Foreign Application Priority Data

May 26, 1999 (JP) .......................... 11-145820

(51) Int. Cl.[7] .................. H01L 29/74; H01L 23/62; H01L 23/48
(52) U.S. Cl. .................. 257/355; 257/734; 257/773; 257/173
(58) Field of Search ................ 257/773, 691, 257/734, 48, 173, 355–363

(56) References Cited

U.S. PATENT DOCUMENTS

| 5,455,460 A | * 10/1995 | Hongo et al. ............ 257/734 |
| 5,598,313 A | * 1/1997 | Gersbach ................ 361/56 |
| 5,986,345 A | * 11/1999 | Monnot ................. 257/773 |
| 6,117,693 A | * 9/2000 | Fogal et al. .............. 438/14 |

* cited by examiner

*Primary Examiner*—Tom Thomas
*Assistant Examiner*—Ori Nadav
(74) *Attorney, Agent, or Firm*—Arent Fox Kintner Plotkin & Kahn, PLLC

(57) ABSTRACT

A semiconductor integrated circuit chip has a test pad and a mounting pad that are connected together by a conductor. The mounting pad is connected also to an internal circuit by way of a conductor. Near the test pad, protection diodes are provided, and, beside the test pad, supplied-voltage and ground-voltage application pads for the protection diodes are provided. Moreover, near the mounting pad, mount-assist pads are provided. During inspection, a supplied voltage and a ground voltage are supplied to the protection diodes from probes put on the supplied-voltage and ground-voltage application pads, and inspection is conducted with another probe put on the test pad. When this semiconductor chip is mounted on a semiconductor chip having a similar structure with a bump, the mounting pads and the mount-assist pads of the two semiconductor chips are short-circuited together so that the two semiconductor chips are mounted on each other.

2 Claims, 4 Drawing Sheets

SEMICONDUCTOR INTEGRATED CIRCUIT DEVICE AND A METHOD OF ASSEMBLY THEREOF

BACKGROUND OF THE INVENTION

1. Field of the Invention

The present invention relates to a protection diode for protecting an internal circuit from external static electricity, to a semiconductor integrated circuit device having such a protection diode, to a method of assembling such a semiconductor integrated circuit device, and to an electronic product having such a semiconductor integrated circuit device.

2. Description of the Prior Art

A semiconductor integrated circuit chip has a plurality of pads formed on the surface thereof for connection with another semiconductor integrated circuit chip or other device, and exchange of signals between such an external device and the internal circuit of the semiconductor integrated circuit chip mentioned first is achieved via those pads. When this semiconductor integrated circuit chip is used singly, the pads thereof are connected to a lead frame that leads to the outside of the package, and the entire chip is sealed in a resin mold.

A semiconductor integrated circuit chip is, after a diffusion process and before an assembly process, subjected to inspection, with a probe put on various spots on the wafer substrate, usually on pads formed thereon as described above. During this inspection, and whenever the semiconductor integrated circuit chip is handled unconnected after assembly, it is liable to receive an excessive voltage as resulting from static electricity from the probe or the lead frame. Such an excessive voltage, if applied to the internal circuit via the pads, causes destruction of the internal circuit.

For this reason, as shown in FIG. 5, a MOS IC is usually provided with protection diodes that constitute a protection circuit. A pad 2 formed on a semiconductor integrated circuit chip 1 is connected to an internal circuit 7 by way of a conductor 3. On the conductor 3, near the pad 2, a protection circuit 6 is provided that is composed of diodes 4 and 5.

Exchange of signals with the internal circuit 7 is achieved via the pad 2 by way of the conductor 3. The protection circuit 6 is provided to protect the internal circuit 7 when an excessive voltage is applied from outside of the semiconductor integrated circuit chip 1.

Across the diodes 4 and 5 constituting the protection circuit 6, there exist parasitic capacitances 8 and 9 due to the junction capacitances that appear at junctions produced by diffusion. These parasitic capacitances 8 and 9 act not only to increase electric power consumption but also, in a device such as a CPU or an image processing chip for a personal computer, to impose a limit on the processing rate of the device.

For example, suppose that the parasitic capacitance of a protection diode is 5 pF. Then, in a semiconductor integrated circuit chip operating from a 3.3 V source, the delay time and the transient current are evaluated as described below on the basis of the following formula:

$$T = C/R = C \cdot E/I$$

where

T represents the time constant,
C represents the capacitance,
R represents the resistance,
E represents the voltage (the amplitude of the signal), and
I represents the transient current.

Specifically, if it is assumed that the delay time is 1 ns, a transient current of 16.5 $\mu$A needs to be supplied, and thus electric power consumption increases accordingly. This delay time results from a single protection diode. That is, in cases where, as in a multichip IC, the pads of two IC chips are connected together with solder bumps or wires as will be described later, a transient current of 33 $\mu$A, i.e. twice the current given just above, needs to be supplied.

In addition, a delay of 1 ns corresponds to a 10% delay in a semiconductor integrated circuit chip operating at 100 MHz, which is not a degree of delay that can be ignored. Given that faster processing rates are generally welcomed in many devices, parasitic capacitances pose a serious problem by preventing achievement of higher processing rates and of lower electric power consumption.

FIG. 6 is a diagram showing chip-on-chip mounting using solder bumps as is commonly practiced today. On a semiconductor integrated circuit chip 1, another semiconductor integrated circuit chip 10 is mounted in such a way that the two chips face each other. Then, their pads are connected together with solder bumps 11. Here, each pad is provided with a protection circuit 6 as shown in FIG. 5. However, in mounting as shown in FIG. 6, connection is achieved in a way as shown in FIG. 7, and therefore there is no risk of an excessive voltage being applied to the pads from the outside. Accordingly, the protection circuits 6 do not necessarily have to be provided.

However, in reality, even in a case like this where no protection circuit is necessary, protection circuits 6 are provided which are each accompanied by parasitic capacitances as shown in FIG. 5 that cause the problem described above. It is possible, with mounting as shown in FIG. 6 in mind, to produce semiconductor integrated circuit chips having no protection circuit provided for their pads. This, however, is impractical because it increases the risk of the internal circuit being destroyed by application of an excessive voltage during an inspection or assembly process.

SUMMARY OF THE INVENTION

An object of the present invention is to provide a semiconductor integrated circuit device having a protection circuit that is effective in inspection and assembly processes but that permits a high processing rate in actual operation, and to provide a method of assembling such a semiconductor integrated circuit device.

To achieve the above object, according to one aspect of the present invention, in a semiconductor integrated circuit device having a protection circuit connected to an external connection pad of the semiconductor integrated circuit device so as to prevent an excessive voltage from being applied to an internal circuit that is connected to the external connection pad, a conductor for applying a voltage to the protection circuit is provided near the external connection pad in the form of a mount-assist pad that is short-circuited to the external connection pad during mounting.

This structure allows a voltage to be applied to the protection circuit by way of the conductor when, for example, the internal circuit is inspected via the external connection pad before mounting. During mounting after inspection, the mount-assist pad and the external connection pad are short-circuited together. This makes it possible to ignore the effect of the capacitances present, for example, across the diodes constituting the protection circuit. The mount-assist pad plays also an assisting role in mounting.

According to another aspect of the present invention, a semiconductor integrated circuit device is provided with:

a test pad to be touched with a probe during inspection;

an external connection pad connected to the test pad by way of a conductor;

first and second voltage application pads;

a first mount-assist pad connected to the first voltage application pad and provided near the external connection pad;

a second mount-assist pad connected to the second voltage application pad and provided near the external connection pad;

a first protection diode having one end connected to the first voltage application pad and having another end connected to the test pad; and a second protection diode having one end connected to the second voltage application pad and having another end connected to the test pad.

In this structure, the test pad is used as the target to be touched with the test probe during inspection. At this time, the test pad is connected to the internal circuit via the external connection pad. However, since the first and second protection diodes are at one end connected to this test pad and at the other end connected to the first and second voltage application pads respectively, there is no risk of the internal circuit being destroyed by an excessive voltage (whether the voltage is positive or negative) received from the outside via the test pad. On the other hand, during mounting using, for example, a solder bump, the first and second mount-assist pads and the first and second voltage application pads, all formed near the external connection pad, are short-circuited to the external connection pad. Thus, after mounting, both ends of each of the first and second protection diodes are kept substantially at identical potentials, and therefore the parasitic capacitances that accompany them do not exert any effect. This makes it possible to achieve a higher processing rate and lower electric power consumption in the semiconductor integrated circuit device as a whole. Here also, the first and second mount-assist pads play an assisting role in mounting.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
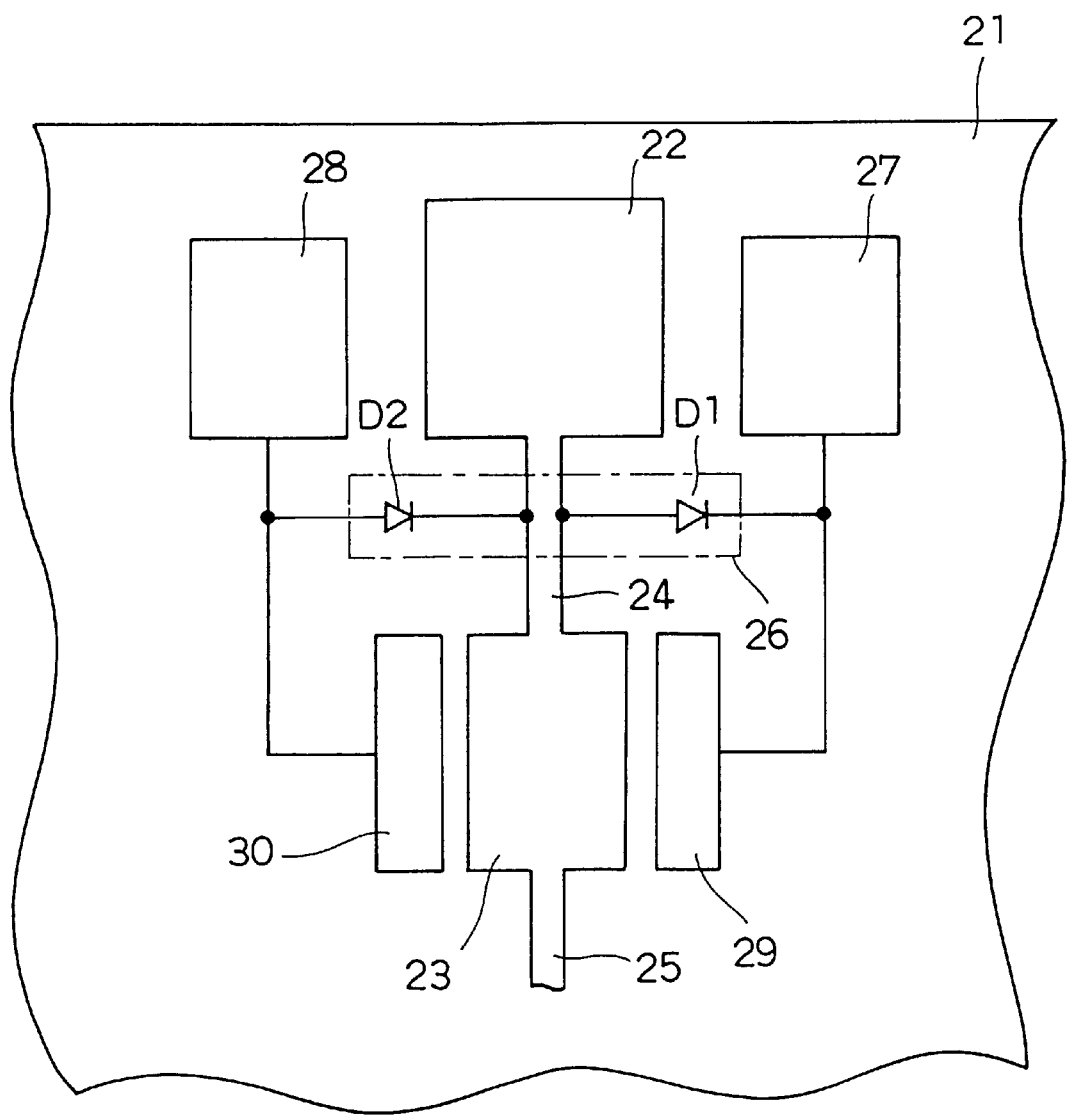
FIG. 1 is a diagram showing the pads of a semiconductor integrated circuit device.

An embodiment of the present invention will be described below with reference to the accompanying drawings. FIG. 1 is a diagram illustrating a portion around an external connection pad of a semiconductor integrated circuit device which is one of the embodiments of the invention. A semiconductor integrated circuit chip 21 has a plurality of pads; more specifically, it has, for each of the input/output signals it handles, a test pad 22 and a mounting pad 23 that are connected together by a conductor 24. The mounting pad 23 is connected to an internal circuit (not shown) by way of a conductor 25.

On the conductor 24, near the test pad 22, a protection circuit 26 is provided. Beside the test pad 22, a supplied-voltage application pad 27 and a ground-voltage application pad 28 for the protection circuit 26 are provided. Near the mounting pad 23, a supplied-voltage-side mount-assist pad 29 and a ground-voltage-side mount-assist pad 30 for the protection circuit 26 are provided. The protection circuit 26 is composed of two diodes D1 and D2, of which one (D1) has its cathode connected to the supplied-voltage application pad 27 and its anode connected to the test pad 22 and of which the other (D2) has its cathode connected to the test pad 22 and its anode connected to the ground-voltage application pad 28.

In an inspection process, a supplied voltage and a ground voltage for the protection circuit 26 are supplied from probes put on the supplied-voltage and ground-voltage application pads 27 and 28. Similarly, another probe is put on the test pad 22 for signal checking to conduct inspection. At this time, even if an excessive voltage is received from the outside via the probe, the protection circuit 26 protects the internal circuit from destruction. For example, if a positive excessive voltage is received via the test pad 22, this voltage is deviated through the diode D1 toward the supplied-voltage application pad 27; if a negative excessive voltage is received via the test pad 22, this voltage is deviated through the diode D2 toward the ground-voltage application pad 28. Thus, there is no risk of such an excessive voltage being applied intact to the internal circuit.

During inspection, a voltage of about 3 V is applied to the supplied-voltage application pad 27. This is to prevent the diode D1 or D2 from causing the voltage applied to the test pad 22 via the probe for inspection to come to have a different voltage than it originally had. To conduct inspection, the internal circuit (not shown) needs to be fed with a supplied voltage, and this is achieved via other pads (i.e. supplied-voltage and ground-voltage pads, not shown). Thus, instead of providing the pads 27 and 28, the voltage for the protection circuit may be supplied from those supplied-voltage and ground-voltage pads (not shown) by way of conductors. The purpose of providing the test pad and the mounting pad separately is to prevent insecure solder-bump connection that may result from a scratch left after a touch on the pad with the probe. Thus, in cases where connection is achieved by wire bonding as will be described later, the test pad may be omitted.

Figure 2:
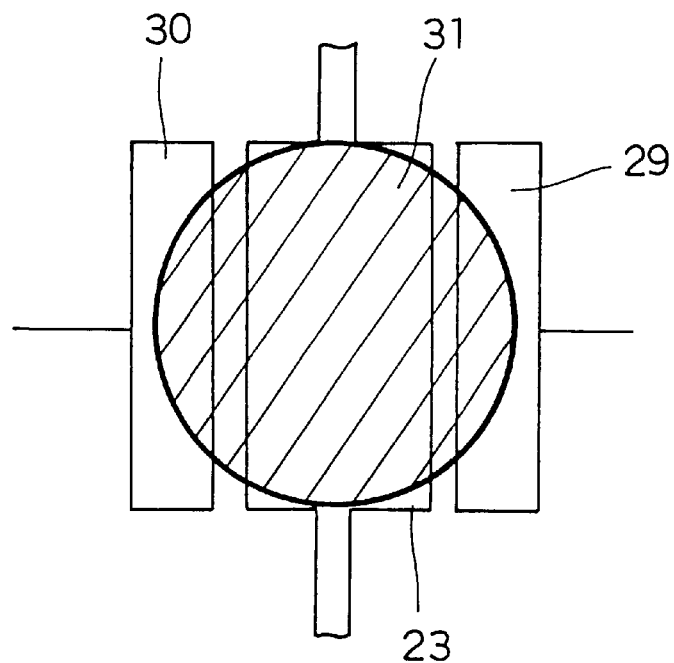
FIG. 2 is a diagram showing the mounting pad used for mounting using a solder bump.
Figure 4:
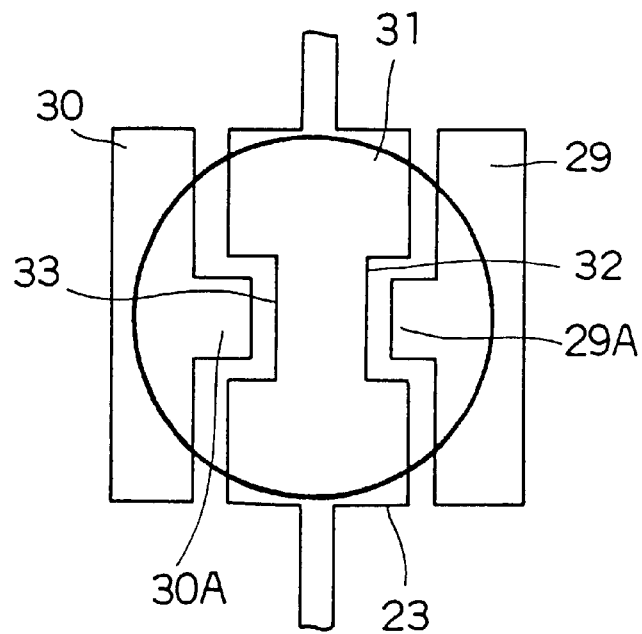
FIG. 4 is a diagram showing another example of the mounting pad.
Figure 5:
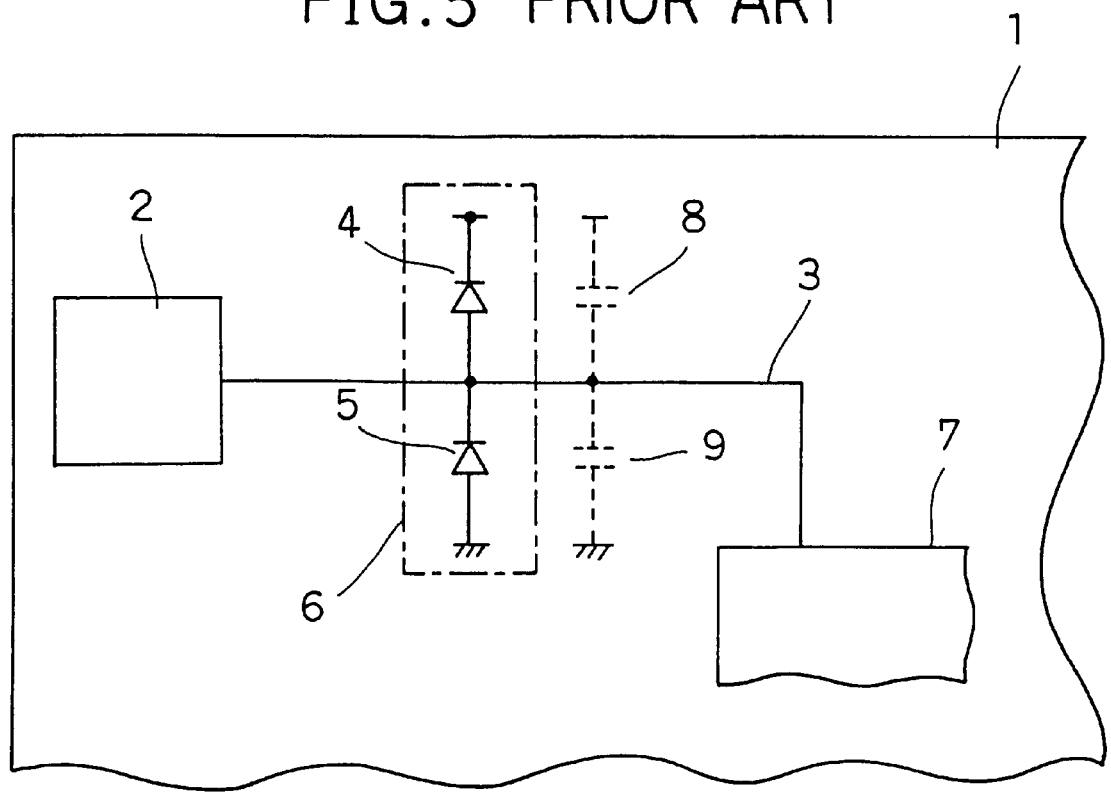
FIG. 5 is a circuit diagram of the pads and protection diodes of a conventional semiconductor integrated circuit device.
Figure 6:
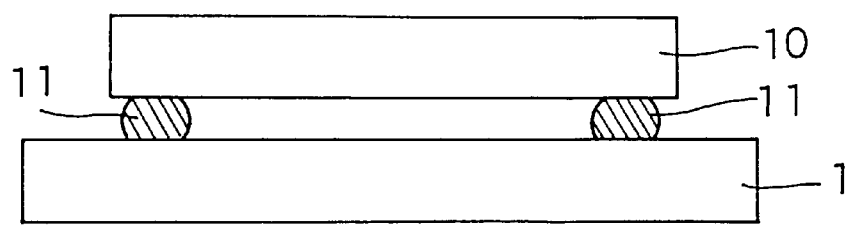
FIG. 6 is a diagram showing mounting using solder bumps.

FIG. 2 is a diagram showing a portion around the mounting pad used for mounting, using a solder bump, of a semiconductor integrated circuit chip having pads as shown in FIG. 1. Here, mounting is achieved by forming the solder bump 31 in such a way that the mounting pad 23 and the supplied-voltage-side and ground-voltage-side mount-assist pads 29 and 30 of the protection circuit 26 are all short-circuited together. Thus, after mounting, the supplied-voltage side and the ground-voltage side of the protection circuit 26 are short-circuited together, and therefore the protection circuit 26 ceases to function. As a result, the parasitic capacitances that accompany the protection diodes, which are no longer necessary after mounting using the solder bump, do not exert any effect. Here, the distances between the individual pads may be the minimum distance as required by the design rules, or may be longer than that. As shown in FIG. 4, it is also possible to form recessed portions 32 and 33 in the mounting pad 23 and form protruding portions 29A and 30A, corresponding to the recessed portions 32 and 33 respectively, in the mount-assist pads 29 and 30. This ensures secure connection even if the solder bump 31 is formed in a somewhat deviated position.

Figure 3:
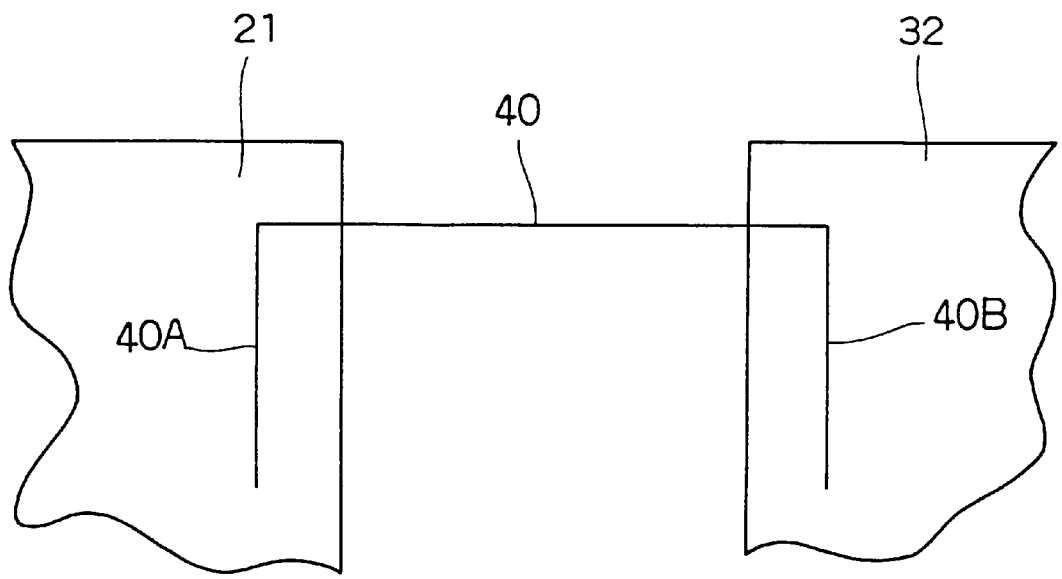
FIG. 3 is a circuit diagram showing two semiconductor integrated circuit chips mounted on each other with a solder bump between them.
Figure 7:
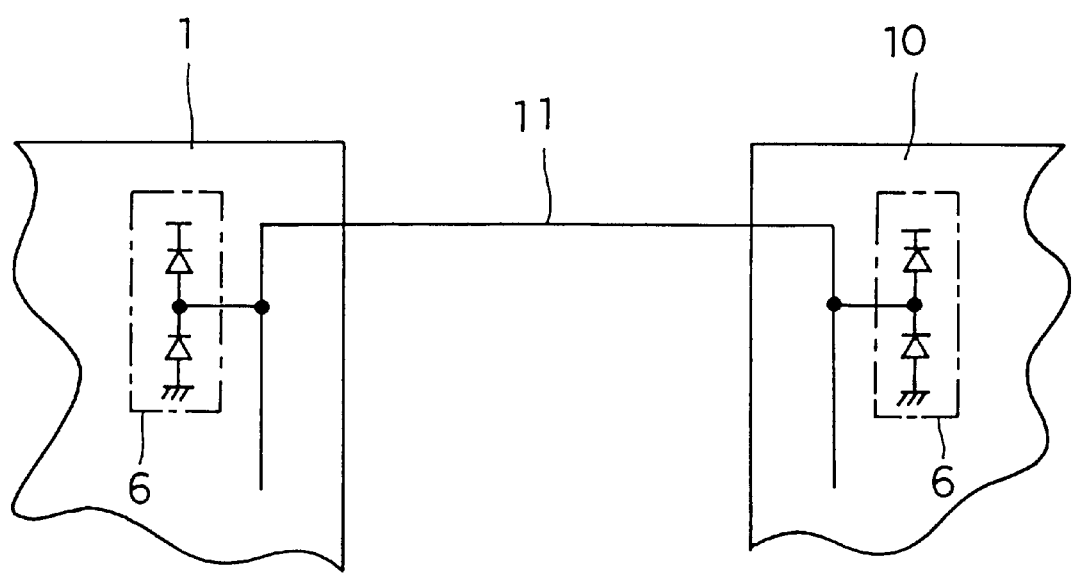
FIG. 7 is a diagram showing the connection achieved by mounting using a solder bump as conventionally practiced.

FIG. 3 is a circuit diagram of two semiconductor integrated circuit chips 21 and 32, having similar pad configurations, that are mounted on each other in the manner described above. Here, there is provided no protection circuit as is found in FIG. 7, and therefore the effect of parasitic capacitances can be ignored. In FIG. 3, the signal paths 40A and 40B are realized as conductors (for example, aluminum conductors) formed within the semiconductor integrated circuit chips 21 and 32 respectively. On the other hand, the signal path 40 outside the chips is realized as the solder bump 31 formed between them.

When a protection circuit as described above is formed on a silicon substrate, the ground-voltage side of the protection circuit is usually connected through the silicon substrate to the common ground voltage. In that case, a protection diode needs to be formed in such a way as to be electrically isolated from the silicon substrate. This, however, does not apply in gallium-arsenide semiconductor chips.

Although the embodiment described above deals with mounting using a solder bump, the bump may be formed out of any material other than solder as long as it can short-circuit together three pads on one semiconductor integrated circuit chip and another three on another semiconductor integrated circuit chip, placed so as to face the first chip, in such a way that the two semiconductor integrated circuit chips are connected together. Moreover, although the embodiment described above deals with a multichip semiconductor integrated circuit device having a chip-on-chip structure, the present invention is applicable also to a multichip semiconductor integrated circuit device that has chips arranged along a plane with the pads of the chips connected together by wire bonding; in this case, short-circuiting of pads is achieved by wire bonding instead of using solder or other bumps.

What is claimed is:

1. A semiconductor integrated circuit device having a multichip structure, comprising:

first and second semiconductor chips, each comprising:
  a test pad to be touched with a probe during inspection;
  an external connection pad connected to the test pad by way of a conductor;
  first and second voltage application pads;
  a first mount-assist pad connected to the first voltage application pad and provided near the external connection pad;
  a second mount-assist pad connected to the second voltage application pad and provided near the external connection pad;
  a first protection diode having one end connected to the first voltage application pad and having another end connected to the test pad; and
  a second protection diode having one end connected to the second voltage application pad and having another end connected to the test pad; and a bump applied, with the first and second semiconductor chips placed so as to face each other, between the first and second semiconductor chips so as to bridge the external connection pads and the mount-assist pads of both of the first and second semiconductor chips so that the external connection pads and the mount-assist pads are short-circuited together and the first and second chips are bonded firmly together.

2. An electronic appliance comprising:

first and second semiconductor chips, each comprising:
  a test pad to be touched with a probe during inspection;
  an external connection pad connected to the test pad by way of a conductor;
  first and second voltage application pads;
  a first mount-assist pad connected to the first voltage application pad and provided near the external connection pad;
  a second mount-assist pad connected to the second voltage application pad and provided near the external connection pad;
  a first protection diode having one end connected to the first voltage application pad and having another end connected to the test pad; and
  a second protection diode having one end connected to the second voltage application pad and having another end connected to the test pad; and a bump applied, with the first and second semiconductor chips placed so as to face each other, between the first and second semiconductor chips so as to bridge the external connection pads and the mount-assist pads of both of the first and second semiconductor chips so that the external connection pads and the mount-assist pads are short-circuited together and the first and second chips are bonded firmly together.

* * * * *